United States Patent
Gambino et al.

(10) Patent No.: US 7,709,766 B2
(45) Date of Patent: May 4, 2010

(54) SYSTEM AND METHOD FOR MANUFACTURING EMBEDDED CONFORMAL ELECTRONICS

(75) Inventors: Richard Gambino, Stony Brook, NY (US); Jon Longtin, Port Jefferson, NY (US); Sanjay Sampath, Setauket, NY (US)

(73) Assignee: Research Foundation of the State University of New York, Stony Brook, NY (US)

( * ) Notice: Subject to any disclaimer, the term of this patent is extended or adjusted under 35 U.S.C. 154(b) by 526 days.

(21) Appl. No.: 10/491,609

(22) PCT Filed: Aug. 5, 2003

(86) PCT No.: PCT/US03/24584

§ 371 (c)(1),
(2), (4) Date: Apr. 2, 2004

(87) PCT Pub. No.: WO2004/013900

PCT Pub. Date: Feb. 12, 2004

(65) Prior Publication Data

US 2005/0029236 A1    Feb. 10, 2005

Related U.S. Application Data

(60) Provisional application No. 60/401,150, filed on Aug. 5, 2002.

(51) Int. Cl.
*B23K 26/38* (2006.01)
(52) U.S. Cl. .................................. 219/121.69

(58) Field of Classification Search ............ 219/121.68, 219/121.69, 68, 69.11
See application file for complete search history.

(56) References Cited

U.S. PATENT DOCUMENTS

| 4,072,768 | A | * | 2/1978 | Fraser et al. .................... 216/65 |
| 4,634,826 | A | * | 1/1987 | Solomon et al. ............... 219/68 |
| 4,909,895 | A | * | 3/1990 | Cusano .................... 219/121.69 |
| 5,065,193 | A |   | 11/1991 | Saitoh et al. |
| 5,126,529 | A |   | 6/1992 | Weiss et al. ............... 219/121.6 |
| 5,161,305 | A | * | 11/1992 | Yamakawa .................... 29/846 |
| 5,203,944 | A |   | 4/1993 | Prinz et al. ................... 156/247 |
| 5,247,278 | A | * | 9/1993 | Pant et al. .................. 338/32 R |
| 5,278,442 | A |   | 1/1994 | Prinz et al. ................... 257/417 |

(Continued)

FOREIGN PATENT DOCUMENTS

DE    40 00 372 A1    12/2009

(Continued)

OTHER PUBLICATIONS

Venkatakrishnan et al., "Femtosecond pulsed laser direct writing system", Jun. 2002, Society of Photo-Optical Instrumentation Engineers, Opt. Eng. 41(6), pp. 1441-1445.*

(Continued)

*Primary Examiner*—Geoffrey S Evans
(74) *Attorney, Agent, or Firm*—F. Chau & Associates, LLC (57) ABSTRACT

A method for fabricating an electronic device comprises providing a substrate (501), direct writing a functional material by a thermal spray on the substrate (502) and removing a portion of the function material to form the electronic or sensory device (503).

15 Claims, 7 Drawing Sheets

U.S. PATENT DOCUMENTS

| | | | |
|---|---|---|---|
| 5,301,415 A | 4/1994 | Prinz et al. | 29/458 |
| 5,466,909 A * | 11/1995 | Nihei et al. | 219/121.72 |
| 5,575,932 A | 11/1996 | Goff | |
| 5,656,186 A * | 8/1997 | Mourou et al. | 219/121.69 |
| 5,824,374 A * | 10/1998 | Bradley et al. | 219/121.69 |
| 6,274,412 B1 | 8/2001 | Kydd et al. | 438/149 |
| 6,331,680 B1 * | 12/2001 | Klassen et al. | 174/261 |
| 6,388,230 B1 * | 5/2002 | Nacker et al. | 219/121.69 |
| 6,545,291 B1 | 4/2003 | Amundson et al. | 257/40 |
| 6,555,411 B1 | 4/2003 | Bao et al. | 438/99 |
| 6,697,694 B2 | 2/2004 | Mogensen | 700/119 |
| 2001/0009250 A1 * | 7/2001 | Herman et al. | 219/121.69 |
| 2002/0149136 A1 * | 10/2002 | Baird et al. | 219/121.67 |
| 2003/0136769 A1 * | 7/2003 | Lin et al. | 219/121.69 |

FOREIGN PATENT DOCUMENTS

| | | |
|---|---|---|
| EP | 544398 A1 * | 6/1993 |
| EP | 0 654 800 A1 | 5/1995 |
| EP | 842707 A1 * | 5/1998 |
| GB | 2327092 A1 * | 1/1999 |
| JP | 59-119701 | 7/1984 |
| JP | 08-193804 | 7/1996 |
| JP | 2001-201451 A * | 7/2001 |
| JP | 2003-133690 A * | 5/2003 |
| WO | WO 93/15594 A1 | 8/1993 |
| WO | WO-93/15594 A1 * | 8/1993 |

OTHER PUBLICATIONS

Jorg Kikelhain Mikrostrukturierung, "Mittels Lasertechnik," SMD-Magazin, pp. 38-40, Jan. 1, 1990.

Database WPI Week 198434, Thomson Scientific, London, GB; 1984-209136 XP-002535889, Aug. 1984.

English Abstract for Publication No. 08-193804, Dec. 1996.

Supplementary Partial European Search Report, Feb. 2009.

* cited by examiner

SYSTEM AND METHOD FOR MANUFACTURING EMBEDDED CONFORMAL ELECTRONICS

CROSS-REFERENCE TO RELATED APPLICATIONS

This application is a National Stage Application of International Application No. PCT/US2003/24584, filed Aug. 5, 2003, which claims the benefit of U.S. Provisional Application No. 60/401,150, filed Aug. 8, 2002.

The U.S. Government has a paid-up license in this invention and the right in limited circumstances to require the patent owner to license others on reasonable terms as provided for by the terms of grant no. N000140010654, awarded by the Department of Defense, DARPA.

BACKGROUND OF THE INVENTION

1. Field of the Invention

The present invention relates to conformal electronic devices, and more particularly to a method of fabricating conformal electronics using additive-subtractive techniques.

2. Discussion of the Prior Art

The adoption of computer-based design, engineering, and analysis tools over the past 10-20 years has resulted in a tremendous acceleration in the development cycle of modern engineering systems. Modern engineering systems are lighter, smaller, last longer, are more efficient, and are far more reliable than their predecessors of even a few years ago. As a consequence, however, these very same engineering systems are becoming extremely complex, with the result that the costs involved to repair such systems, particularly for major component failures, are skyrocketing. Accordingly, the ability to monitor the health of vital engineering components in-situ and non-invasively in real-time is a vital capability that is needed for modern engineering system designs to be fully utilized, so that maintenance costs can be minimized, system health monitored, and major repairs scheduled for the most opportune times.

The sensor system should not disturb or alter any aspect of the system it is interrogating. However, after-market sensors, even if attached during the manufacturing process, can be unreliable, difficult to install, and may adversely affect component operation.

Electronic manufacturing with feature sizes in the meso-scale regime (e.g., about 10 to 1000 micrometers) often needs multi-step processes that include time-consuming photo-lithographic methodologies. The time needed between iterations can often be measured in terms of weeks. In addition, thick film electronics based on ceramic multi-chip module technology, including low temperature co-fired ceramic modules (LTCC-M) and high temperature co-fired ceramic modules (HTCC-M) generally need firing of screen printed pastes to moderate ~800 C. for LTCC-M or high 1400 C for HTCC-M. The high temperature curing process gives rise to issues associated with mismatch in thermal expansion between dissimilar materials and can lead to premature debonding. This needs to be accounted for during the processing through careful tailoring of the properties of the layered materials. Current screen printing technology is inherently limited in its fine feature capabilities, with the line width being limited to 100 microns or higher.

Therefore, a need exists for a system and method of fabricating conformal electronics using additive-subtractive techniques.

SUMMARY OF THE INVENTION

Thermal spray technology coupled with precision laser materials processing has been developed for the fabrication of electronics and sensor fabrication. Thermal spray is implemented for depositing a wide variety of materials that have functional properties as deposited. The materials generally do not need subsequent post-firing, annealing, or other time consuming, costly post processing steps. A variety of materials can be deposited quickly and easily using thermal spray technology. After the deposition, precision laser micromachining using, for example, ultrafast or UV laser systems, can be used to fabricate complex electronic structures. The electronic structures include, for example, resistors, capacitors, coils, transformers, and a variety of sensors, for example, thermistors, thermocouples, thermopiles, strain sensors, magnetic sensors, humidity sensors, gas sensors, flow sensors, heat flux sensors, etc. Furthermore, these sensors can be embedded within a component during manufacture to provide an extremely robust, long-life sensing and health monitoring system for the component, which is superior to after-market, add-on sensors that must be attached manually using adhesives or other post-manufacturing techniques. Also, because the thermal spray technique is self-compatible, it can be used to fabricate three-dimension electronics and sensor systems, e.g., multi-layer sensors on the same surface area footprint, multiple-layer thermopiles for enhanced power production, etc.

A method for fabricating an electronic device, comprises providing a substrate, depositing a functional material by a thermal spray on the substrate, and removing a portion of the functional material to form the electronic or sensory device.

The substrate is flexible. Depositing is a direct writing.

Depositing a functional material further comprises heat treating the functional material. The heat treating is preformed one of before or after removing a portion of the functional material.

Depositing further comprises forming a conformal layer on the substrate. Depositing the functional material further comprises providing one of a metal, a semiconductor, a ceramic, and a polymer in the thermal spray. Depositing the functional material further comprises providing one of a dielectric material and an insulating material.

Removing the portion of the functional material further comprises providing a focused laser beam to the functional material.

The electronic device is fabricated in-situ.

The method comprises coating a portion of the electronic device.

The method further comprises depositing an insulating layer over the functional material after removing the portion, wherein the functional material is a bottom metal comprising at least two parallel strips, wherein a portion of each of the two parallel strips is exposed on each of at least two sides of the insulating layer, depositing a top metal of functional material by the thermal spray over the insulating layer and exposed portions of the two parallel strips, and removing a portion of the top metal of functional material, forming at least one strip, the at least one strip connecting a portion of one of the two parallel strips exposed on a first side of the insulating layer and a portion of a second strip of the two parallel strips exposed on a second side of the insulting layer.

A system for fabricating an electronic device comprises a thermal spray device for depositing a conformal layer of a functional material, and a material removal device for fabricating an electronic device from the conformal layer of the functional material.

The system comprises a fixture for retaining a substrate upon which the conformal layer of the functional material is deposited.

The material removal device comprises a programmable motion device. The programmable motion device comprises a processor for receiving instructions and an articulated arm supporting the material removal device proximate to the conformal layer of the functional material, the articulated arm following the instructions received by the processor. The programmable motion device comprises a processor for receiving instructions and an articulated stage supporting the conformal layer of the functional material proximate to the material removal device, the articulated arm following the instructions received by the processor.

The material removal device comprises a laser. The material removal device is one of a water jet, a mechanical milling machine, and electric discharge machine.

The functional material is functional as deposited.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

Direct write electronics technologies provide an opportunity to integrate mesoscopic electronic devices with the physical structure on which the electronic systems will be used, eliminating the need for a traditional printed circuit board. The ability to print electronic features on flexible and conformal substrates enables unique applications for deployable electronics, such as placing electronics in projectiles, for flexible satellite solar arrays, usage in rolled-up forms that can be inserted into symmetric or odd shapes, installed on military gear, as well as various surveillance equipment. This can save space and reduce weight through 3-D integration. It can provide a dramatic cost savings by eliminating the majority of passive components in automated fabrication, while minimizing procurement. It can reduce inventories of electronic components or parts, enable the building of specialty parts on the "fly" without mass production set-up costs, and increase the reliability of rugged electronic components due to the automated assembly process and the absence of solder joints.

According to an embodiment of the present invention, thermal spray technology coupled with precision laser materials processing have been developed for the fabrication of electronics and sensor fabrication. Thermal spray is implemented for depositing a material having functional properties as deposited, e.g., without the need for subsequent post-firing, annealing, or other time consuming, costly post processing steps in most cases, although these processes can be performed if desired. A variety of materials can be deposited quickly and easily using thermal spray technology. After the deposition, precision laser micromachining using, for example, ultrafast or UV laser systems, can be used to fabricate complex electronic structures, for example, resistors, capacitors, coils and transformers, and can also be used to fabricate a variety of sensors, for example, thermistors, thermocouples, thermopiles, strain sensors, magnetic sensors, humidity sensors, gas sensors, flow sensors, heat flux sensors, etc. Furthermore, these sensors can be embedded within a component during manufacture to provide an extremely robust, long-life sensing and health monitoring system for the component, which is superior to aftermarket add-on sensors that need to be attached manually using adhesives or other post-manufacturing techniques. Also, because the thermal spray technique is self-compatible, it can be used to fabricate three-dimension electronics and sensor systems, e.g., multilayer sensors on the same surface area footprint, multiple-layer thermopiles for enhanced power production, etc.

A sensor that is directly embedded into the component in a coordinated manner has substantial advantages in terms of reliability, longevity, and minimal disturbance of component function.

According to an embodiment of the present invention, a system and method has been developed for the fabrication of sensors and electronics for condition based maintenance and remote health monitoring of engineering systems. Direct-writing technology can be implemented for wide ranging functional electronics and sensor structures including metals, semiconductors, ceramics and polymers on virtually any surface. Direct-write line widths can be in the range of 200 microns and larger. According to an embodiment of the present invention, single layer and multi-layer electronic devices can be fabricated through additive mask-free, environmentally benign electronics processing technology. Direct writing systems can be used for prototyping concepts in manufacturing as well as provide new capabilities for the fabrication of novel embedded electronics and sensor systems.

According to an embodiment of the present invention, systems and methods can combine additive-subtractive fabrication using direct write thermal spray for material addition, followed by an ultra-fast, UV, or other laser processing step for material removal. This can allow a substantial reduction in line width to the 10-micron level and below, as well as the ability to use virtually any material. This approach can enhance the flexibilities of both processes, e.g., flexibility of thermal spray to deposit virtually any material/create multiple layers on low temperature substrates, and the advantage of ultra-fast or UV pulsed lasers to non-thermally remove materials with minimal thermal damage. Other material removal systems can be used, for example, a water jet, electric discharge machining, or milling machine.

The capabilities include demonstration of the hybridized thermal spray/laser subtraction concept for an embedded sensor system for remote health monitoring of harsh environment engineering systems. An extended capability will involve incorporating wireless concepts for passive or semi-passive embedded sensors using R-L-C circuits for untethered monitoring of the components.

The potential applications of such technology are unique and far-reaching. Examples include strain gauges, thermistors, thermocouples, thermopiles (thermocouples in series for power generation), magnetic and piezo sensors, interdigitated capacitors for L-C circuits, antennas, microheaters (for integration into chemical and biological sensors), among others. It will allow novel sensor and electronic devices to be prepared in-situ and, to do so in environmentally friendly lean manufacturing methods.

Direct write electronics technologies provide an opportunity to integrate mesoscopic electronic devices with the physical structure on which the electronic systems will be used, eliminating the need for a traditional printed circuit board. The ability to print electronic features on flexible substrates enables unique applications for deployable electronics, such as placing electronics in projectiles, for flexible satellite solar arrays, usage in rolled-up forms that can be inserted into symmetric or odd shapes, installed on military gear, as well as various surveillance equipment. This saves space and reduces weight through 3-D integration. It provides a dramatic cost savings by eliminating the majority of passive components in automated fabrication and minimizing procurement. It reduces inventories of electronic components or parts, enables the building of specialty parts on the "fly" without mass production set-up costs, and increases the reliability of rugged electronic components due to the automated assembly process and the absence of solder joints.

According to an embodiment of the present invention, a system and method combines the thermal spray capabilities with complementary precision laser subtraction to provide substantially improved capabilities for manufacturing embedded, conformal electronics and sensors. For example, according to an embodiment of the present invention, the material versatility of thermal spray for material deposition and course patterning is coupled with the fast, precision material removal capabilities of ultra fast and UV lasers, which use non-thermal material removal mechanisms that minimize thermal damage associated with more traditional laser processing. This combination capitalizes on the strengths of both techniques: wide material versatility coupled with high-precision (~10 µm) rapid patterning ability. Also, multi-layer structures can be built with this technology, and electrical connections, e.g., vias, have been successfully created to make electrical connections across both layers.

Thermal spray is a directed spray process in which material is accelerated to high velocities and impinged upon a substrate, where a dense and strongly adhered deposit is rapidly built. Material is injected in the form of a powder, wire, or rod into a high velocity combustion or thermal plasma flame, or wire arc, or a cold-spray (non-thermal) spray process, which imparts thermal and kinetic energy to the particles. By controlling the plume characteristics and material state (e.g., molten, softened), it is possible to deposit a wide range of materials (metals, ceramics, polymers and combinations thereof) onto virtually any substrate in various conformal shapes. The ability to melt, soften, impinge, rapidly solidify, and consolidate introduces the possibility of the synthesizing useful deposits at or near ambient temperature. The deposit is built-up by successive impingement of droplets, which yield flattened, solidified platelets, and referred to as 'splats'. The deposit microstructure and, thus, properties, aside from being dependent on the spray material, rely on the processing parameters, which are numerous and complex.

Thermal spray has been used for decades for large-scale applications, including, for example, TBCs in turbine engines, internal combustion engine pistons and cylinder bores, and corrosion protection coatings on ships and bridges. Thermal spray can be used for meso-scale (e.g., about 100 µm-10 mm) structures, particularly for electronic applications. Thermal spray methods can be used to form thick (e.g., greater than about 20 µm), smooth deposits of a wide range of ceramics, including alumina, spinel, zirconia, and barium titanate. Additionally, thin (e.g., less than about 200 µm wide) metallic lines of Ag, Cu, as well as Ni-based alloys, can be produced with square sides and that have electrical conductivities as good as, and in some cases superior to, conductor lines formed using thin-film methods. Spray production technologies for coatings and direct-write lines include for example, combustion, wire arc, thermal plasmas and even cold spray solid-state deposition.

The advantages of direct-write thermal spray for sensor fabrication include, for example, robust sensors integrated directly into coatings, thus providing unparalleled coating performance monitoring, high-throughput manufacturing and high-speed direct-write capability, and useful materials electrical and mechanical properties in the as-deposited state. In some cases, the properties can be further enhanced by appropriate post-spray thermal treatment. Further advantages include being cost effective, efficient, and able to process in virtually any environment, robotics-capable for difficult-to-access and severe environments, can be applied on a wide range of substrates and conformal shapes, and is rapidly translatable development to manufacturing.

Thermal spray methods offer means to produce blanket deposits of films and coatings as well as the ability to produce patches, lines, and vias. Multiple layers can be produced on plastic, metal, and ceramic substrates, both planar and conformal. Embedded functional electronics or sensors can be over coated with protective coating, allowing applications in harsh environments. Such embedded harsh environment sensors can be used for condition-based maintenance of engineering components.

High-power ultra fast laser systems, in which the laser pulse duration is measured in femto- or pico-seconds have advantages over their thermal-based counterparts, including, minimal temperature rise and thermal damage in processed material, a wide range of applicable materials, precision machining capabilities, sub-surface (3-D) machining, and high-aspect-ratio processing.

Ultra fast systems can use titanium-doped sapphire (Ti:sapphire) as the lasing medium, and chirped-pulse amplification (CPA) to produce femtosecond laser pulses with milli-joule energy levels.

UV-wavelength, nanosecond-pulse lasers implement a pulse duration tens of thousands of times longer than an amplified femto-second system, and use a wavelength in the UV region (typically about 355 nm or shorter), which results in direct bond-breaking by the incident photons. As such, like the ultra fast lasers, material is removed in a non-thermal mechanism (thermal damage is minimized), though not to the same extent as ultra fast lasers.

The use of ultra fast and UV lasers for precision materials processing works well with a wide variety of thermal spray materials that can be deposited for sensor and electronic applications. The combination of these two technologies provides for the capability to fabricate robust, embedded sensors in functional components.

Sensors can include, for example, thermistors and thermocouples for temperature measurement as well as serpentine strain gauges for strain measurement. Temperature and strain are two of the most important parameters in engineering systems such as internal combustion and turbine engines, power transmission systems, fluid power components, transportation equipment, general manufacturing systems, etc. A thermopile can be fabricated, which is a series of thermocouples (as many as 100-200) in series to produce useful voltage and current, for power generation in-situ using an existing temperature difference in the system.

The flexibility of thermal spray in its material deposition capability combined with the simplicity and reliability of the thermocouple as a temperature sensor and the strain gauge as a strain sensor make thermal-spray-based thermocouples and strain gauges a natural choice. E-type and K-type thermocouples, and serpentine strain gauges can be fabricated using variations of thermal spray. Substrates sprayed include pure alumina and spinel coated steel.

Figure 1:
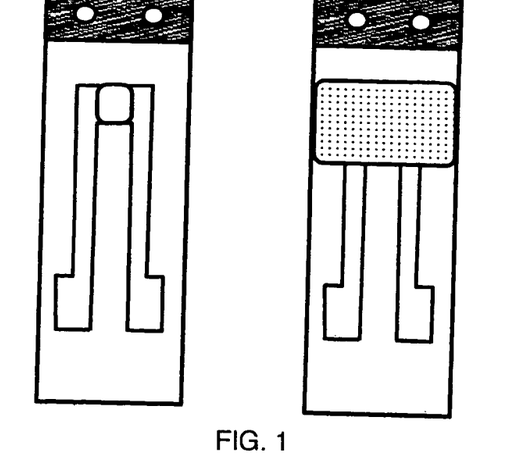
FIG. 1 is a Ni—Cu strain gauge deposited by thermal spray, forming a K-type thermocouple, exemplifying the use of a selective overcoat, according to an embodiment of the present invention.

FIG. 1 shows a bare thermal-sprayed thermocouple (left) as well as a thermocouple that has been coated with alumina (right) to demonstrate the ability to embed such sensors underneath functional coatings.

According to an embodiment of the present invention, thermal barrier coatings can be used to introduce a temperature difference in the presence of an otherwise uniform heat load or temperature field. Thermal barrier coatings (TBCs) can be been traditionally used to provide enhanced component lifetime in high temperature, harsh environments by providing additional thermal resistance to heat flow to the device. The TBC is thermal sprayed over the component, though other coatings for wear and corrosion can also be used. The TBC material is chosen to have a low thermal conductivity, hence in service heat will experience a resistance in moving from the top of the TBC to the component that is being protected underneath. Temperature differences of about 100° C. are can be experienced. By using a TBC to selectively coat one side of a thermopile, for example, a non-uniform temperature distribution would be produced in the presence of a uniform heat flux, for example from a flame, or a panel exposed to solar radiation. The temperature difference, in turn, can be used with the thermopile concept to produce useable electricity as discussed above.

Thermal spray technology can be used to fabricate integral strain gauges directly onto system components or surfaces. Furthermore, the combination of a strain gauge and a temperature sensor, which provides both material temperature and compensation for the strain gauge, represent an extremely powerful combination. One popular material for high-temperature metallic strain gauges is NiCr. NiCr can be sprayed to form, for example, heaters and other laser patterned devices. The initial strain gauge development was based on NiCr, an inexpensive, readily obtainable material that also has useful properties.

Strain gauge fabrication using thermal spray can be obtained using a single material for the sensor device itself. The same material, e.g., NiCr, may also be used for both the strain sensor and the lead wires, provided the width and thickness of the lead wires are increased such that the effective resistance of the lead wire is negligible compared to the strain gauge element. In practice this can be done by increasing the spray line width, while also depositing the lead wires at a slower velocity—with the same material feed rate—to increase line thickness. A five-fold increase in line width and thickness over the strain sensor line dimension, for example, results in a lead wire resistance of only 4% that for an equivalent length of sensor patterning.

Figure 2:
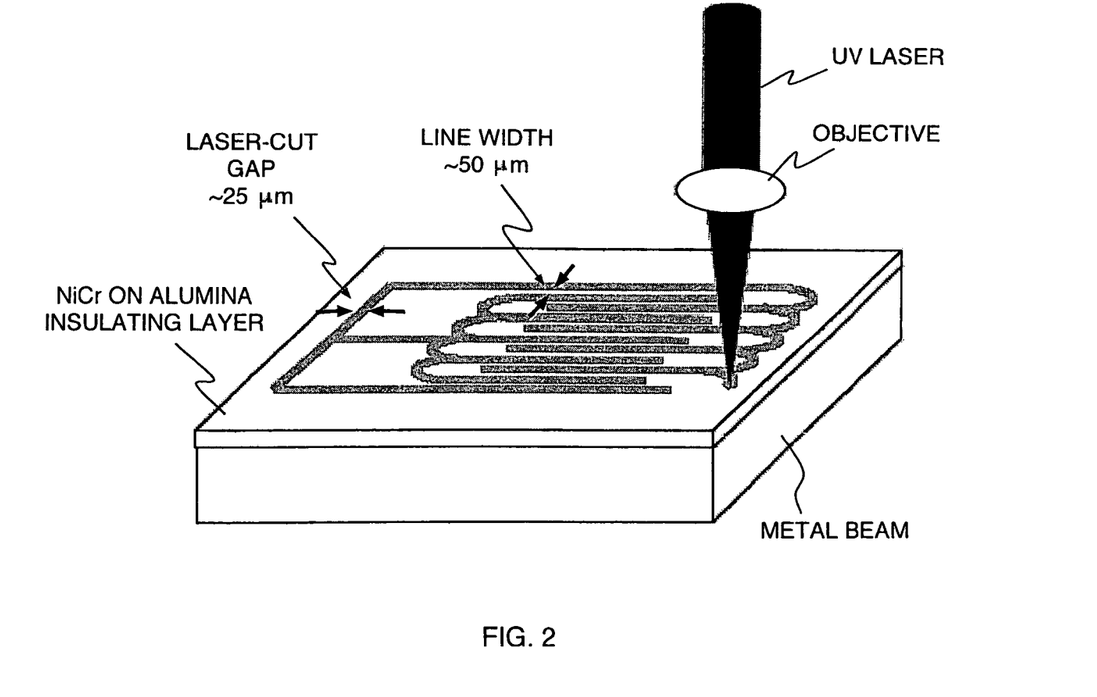
FIG. 2 is a diagram of laser processing of thermal spray deposit to fabricate a strain gauge according to an embodiment of the present invention.

Referring to FIG. 2, the strain gauge pattern can be fabricated using either the ultra fast or UV lasers, and the patterns follow conventional strain gauge design, with a serpentine series of thermal spray traces forming the gauge. Specific dimensions are determined by the desired gauge resistance, size, sensitivity, and maximum expected strain.

Figure 3:
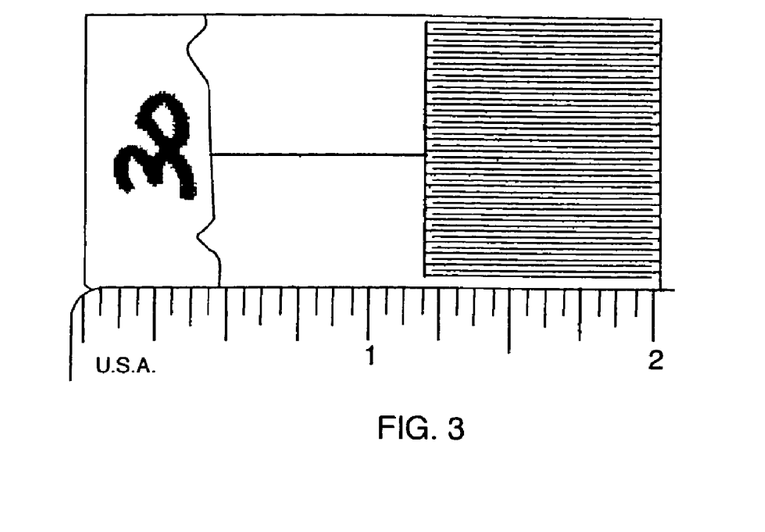
FIG. 3 is a diagram of a laser patterned Ni—Cu strain gauge deposited by thermal spray according to an embodiment of the present invention.

Testing can be performed using precision multimeters or a standard Whetstone-bridge-based system to record resistance while the test specimen is strained a known amount. During testing, a thermocouple can be attached directly over the strain gauge to compensate for temperature during the measurement. A functioning prototype strain gauge fabricated using the ultra fast laser is shown in FIG. 3.

Figure 4:
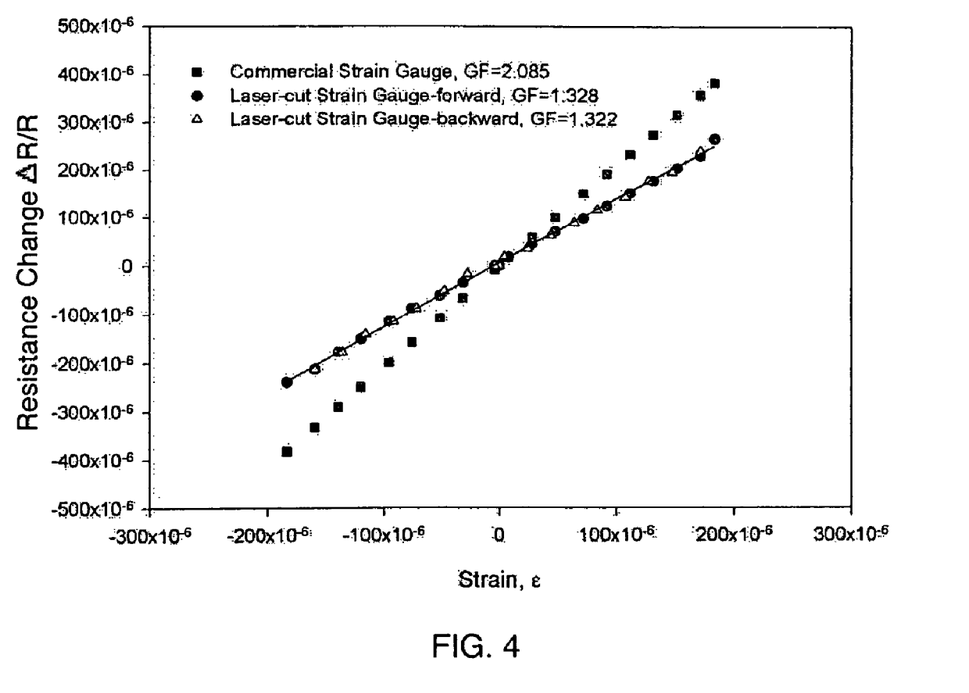
FIG. 4 is a graph of resistance versus strain for a NiCr thermal spray strain gauge patterned using a laser system.

The results for a similar strain gauge fabricated using thermal spray technology followed by ultrafast laser materials processing is shown in FIG. 4. Repeatability between devices, in this case two gauges, linearity, and lack of hysteresis are attributes of devices fabricated according to an embodiment of the present invention. The gauge is fabricated on an alumina substrate, which is then fixed at one end as a cantilever beam, while the free end is displaced a known amount. A commercial strain gauge was attached to the sample as well to provide a reference for the true strain of the specimen.

More sophisticated patterns are also possible, including depositing two mutually orthogonal patterns to measure strain in the x and y-directions simultaneously. Thermal spray protective overcoats can be applied for protection to the same gauge, which will then be re-tested to assess how the overcoat influences gauge operation. It is also possible to fabricate arrays of strain sensors to determine variation in strain as a function of location on a component. Strain gauge design can also be designed to minimize temperature drift.

Strain gauges are ubiquitous and indispensable in devices that range from micro-weight scales to structure health monitors in buildings and bridges. Commercial devices are usually pre-fabricated, packaged and bonded or otherwise attached to the structure to be monitored. Our approach to mesoscale manufacturing allows strain gauges to be fabricated in situ. Further, the sensor might even be hardened with a final spray coat of a suitable impervious material.

In many remote sensor-monitoring situations, wireless concepts are required since access is not easy. For active wireless systems, local power is essential to drive the circuit. One way to obtain this power, for example, in hot component monitoring, is power harvesting through thermo-piles which is an extension to thermocouple technology.

Thermocouples produce a voltage proportional to the temperature difference across their junctions. As temperature sensors, they work very well. Their output voltage, however, is on the order of several tens of millivolts per ° C., making useful voltage levels for powering electronic circuits, e.g., 1-5V difficult without extremely large temperature variations. A thermopile is a collection of thermocouples wired electrically in series and thermally in parallel so that their voltages add. The idea is to fabricate a thermopile into a component that normally experiences some form of a temperature gradient during operation, e.g., an exhaust manifold, heat sink, friction-heated surface, or substrate for a chemical reaction. In the presence of a temperature difference, the thermopile will convert some of the heat flow directly to electric power, which can be used local activation of circuits.

The total thermopile output voltage (assuming a very high load resistance so that current draw does not alter the voltage) is $NS_{ab}\Delta T$, where N is the number of thermocouples, $S_{ab}$ the Seebeck coefficient, and $\Delta T$ the temperature difference between hot and cold temperature sources. For a given thermocouple material and temperature difference, only N can be increased to increase the output voltage. Recent work has focused on the design and fabrication of multi-element thermopiles for power generation and enhanced sensor applications using thermal spray and MICE technology. A unique feature of this design is the multilayer capability of thermal spray.

Figure 5A:
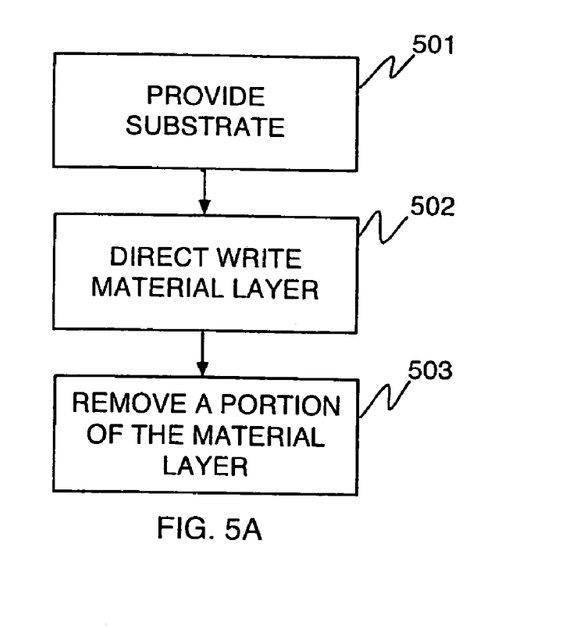
FIG. 5 is a diagram of the stages of thermal spray/laser patterning of a multiplayer thermopile according to an embodiment of the present invention.
Figure 5B:
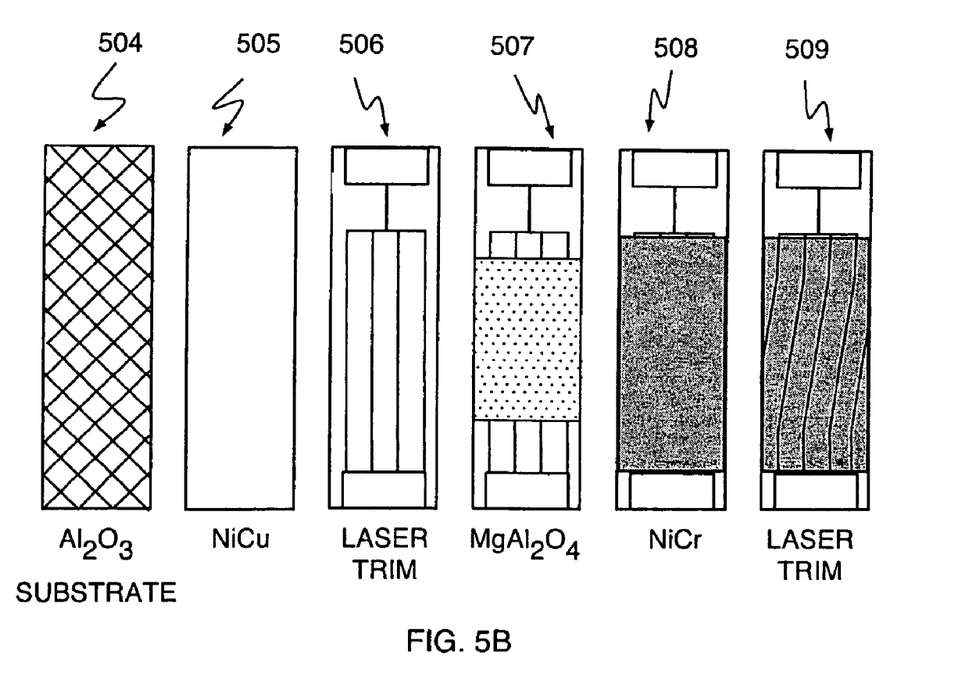
Figure 6:
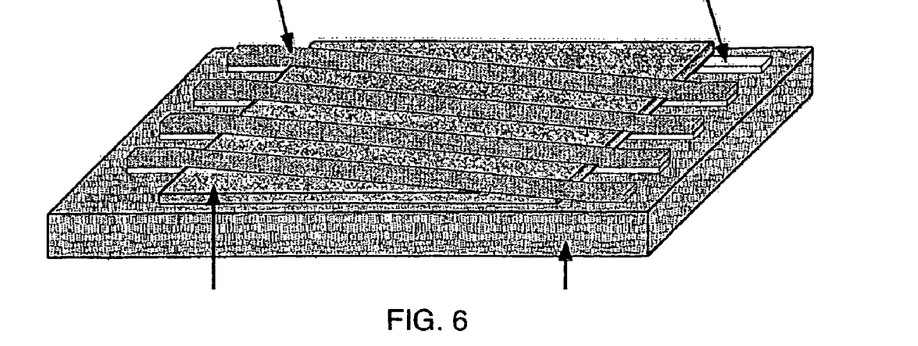
FIG. 6 is a diagram of a multilayer thermopile, showing connectivity between bottom and top layers according to an embodiment of the present invention.

In this design a substrate is coated with an optional insulating layer and then the first alloy of the thermocouple (NiCr in this example) is deposited. The sample is then sent to the ultra fast processing laboratory in which the NiCr patch is cut into a collection of N parallel strips. The sample is then sent back to the thermal spray facility for an insulating overcoat, followed by the deposition of the second thermocouple alloy (NiCr in this case). Finally the top layers are patterned using the ultra fast laser again to provide electrical separation between layers, while providing an electrical series connection. This is done by slightly staggering the top laser pattern to connect the positive terminal of one thermocouple to the negative of the next. Proof-of-concept designs were successfully completed with N=4. For a K-type thermocouple (NiCr/NuCu), each thermocouple produced approximately 5.5 mV for a total potential of ~22 mV with a temperature difference of ~125° C. A figure of the device in the various stages of fabrication is shown in FIG. 5, and a schematic of the device is shown in FIG. 6.

Figure 7:
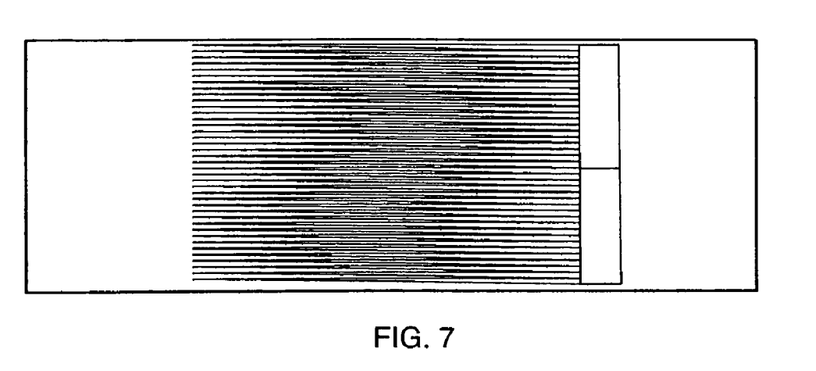
FIG. 7 is a diagram of a 40-element thermopile fabricated with NiCr/NuCu on alumina, with both positive and negative connector leads on the left-hand side of device according to an embodiment of the present invention.

Second-generation devices have been fabricated with N ranging from 20-250. A recent K-type thermopile device with N=40 produced a voltage of ~0.5V for a temperature difference of ~300° C. between hot and cold junctions, and is shown in FIG. 7.

Figure 8:
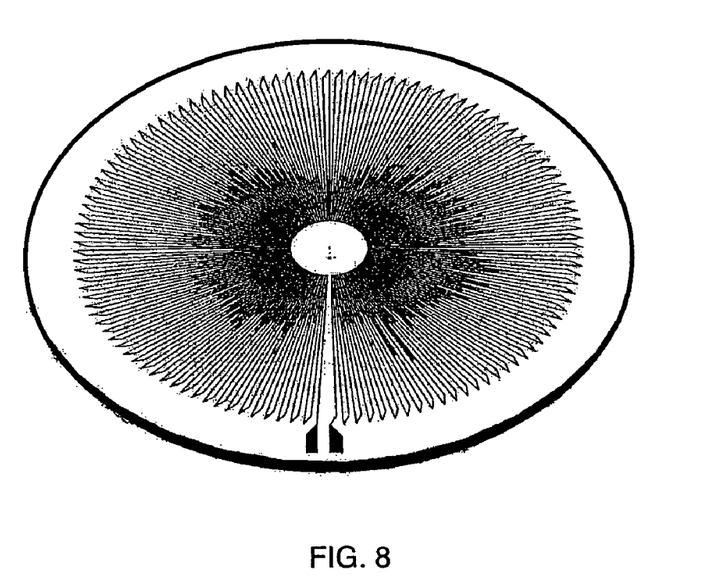
FIG. 8 is a diagram of a "star" thermopile concept, where the two thermocouple materials are represented by different shaded lines, according to an embodiment of the present invention.
Figure 9:
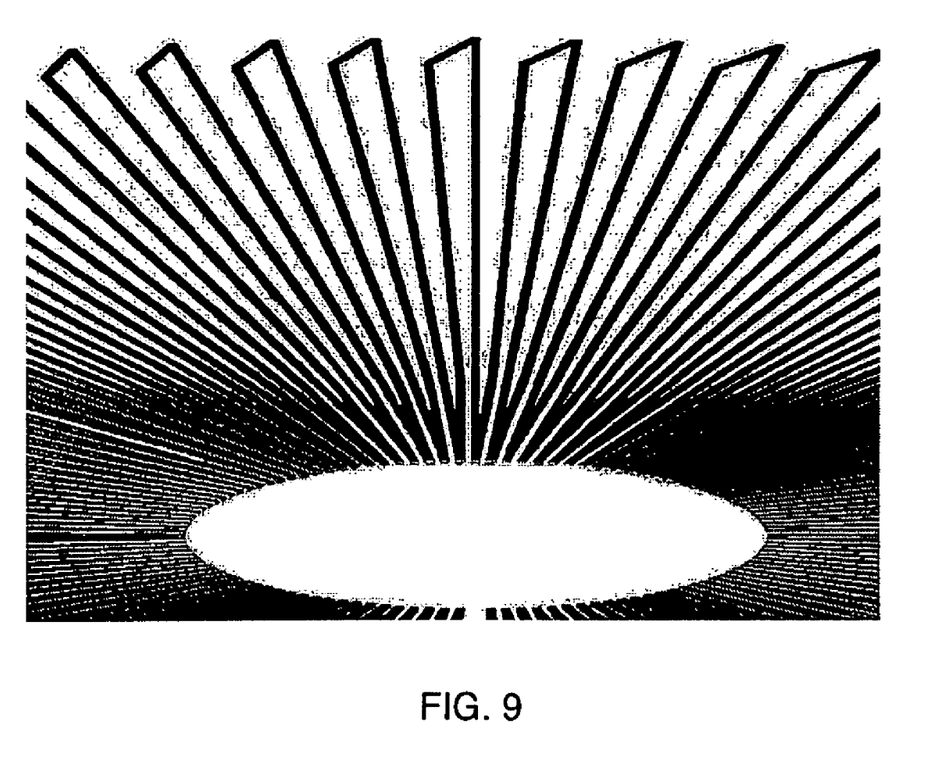
FIG. 9 is a close-up diagram of the star thermopile interface between dissimilar materials at inner and outer radii according to an embodiment of the present invention.

In addition to the linear thermopile described above, a radial thermopile can also readily be fabricated, as shown in FIGS. 8 and 9. In this design, one junction is formed on the inside of the ring structure, and the second junction is formed at the outside ring. As for the linear thermopile the two thermoelectric materials are alternately deposited side by side and connected at their ends to form the thermoelectric junctions. A heat source can be applied at the geometric center of the thermopile array, for example, by using a flame, torch, or by attaching a conducting material that is thermally connected to a heat source. The outer edge of the circle is maintained at a lower temperature either by natural means, for example, natural convection or by the use of fins, or by active cooling, using flowing gas, liquid or other means to maintain a temperature difference between the center and periphery of the star thermopile. Note that the device can work equally well by reversing the heat source and heat sink, e.g., by heating the edges and cooling the center.

Figure 10:
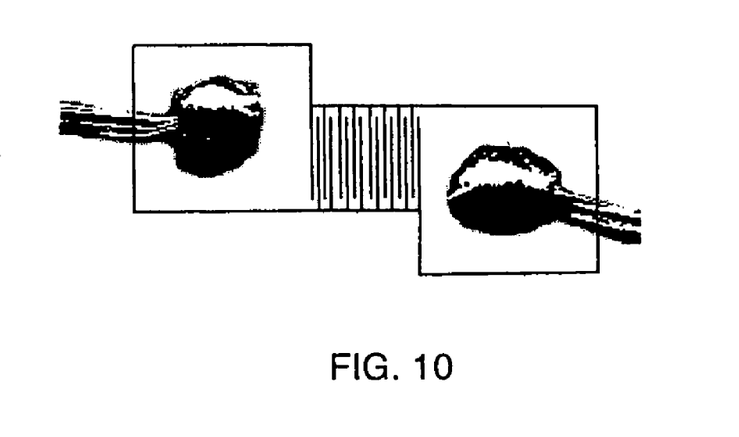
FIG. 10 is a diagram of a micro-heater laser patterned into NiCr coating on an alumina substrate according to an embodiment of the present invention.
Figure 11:
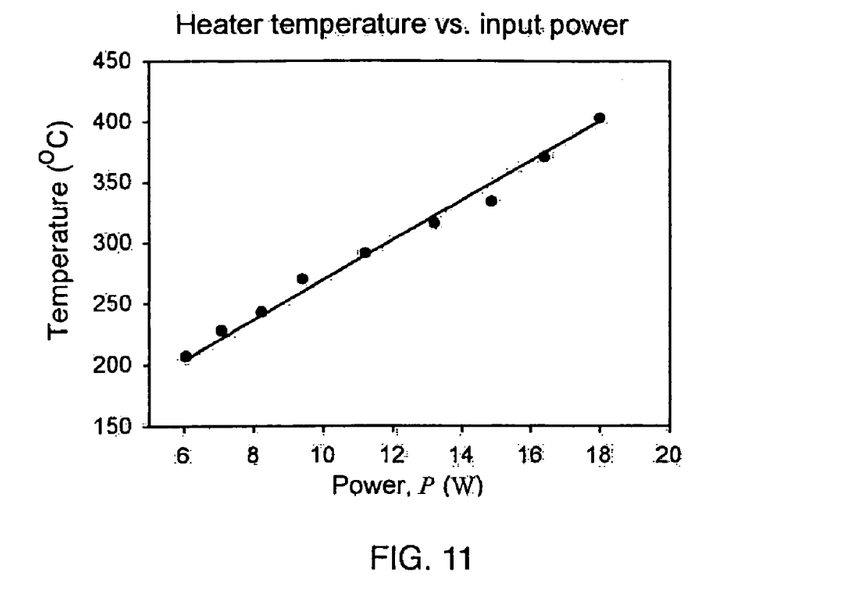
FIG. 11 is a graph of heater temperature versus input power for heater in FIG. 10.

Microheaters are resistive elements designed to deliver heat locally to a device. They find wide application in everything from gas flow sensors to microfluidic lab-on-a-chip devices. A thermistor is a device whose resistance is a sensitive (and known) function of temperature. Together, microheaters and thermistors allow closed-loop control of temperature, even under dynamic conditions such as ambient temperature or varying thermal load. Suitable resistor materials can be deposited on a variety of insulating subtracted included alumina and spinel, as well as plastic, wood, and ceramics. Similar to the strain gauge devices discussed above, these materials are precision laser patterned using an ultrafast or UV laser to form a heater element with the desired geometry, resistance, surface area, and temperature variation (if desired). Semiconductor thermistor material can also be deposited in the vicinity of the heater to operate as a thermistor sensing device. Such a combination will facilitate tighter temperature control and faster response. Thermal sprayed thermistors as well as heater elements can be fabricated. A photograph of the device is shown in FIG. 10, and the device temperature as a function of input power is shown in FIG. 11.

Thermal spray can be used to deposit thin lines of material for direct-write of electronics. These lines, while achieving line widths of 300 μm or larger, are difficult to fabricate in sized much smaller than this. Ultrafast laser processing can be used to pattern thermal spray deposited lines for even finer feature resolution. To trim a thermal spray line, the laser makes multiple passes on both sides of the line, starting from the outside and working towards the center. The thickness of the line is determined by stopping at a prescribed distance from the centerline. The depth of the machining into the SPL and substrate is determined by the stage speed. The motion control system provides for positioning accuracy of 0.5 μm.

Figure 12:
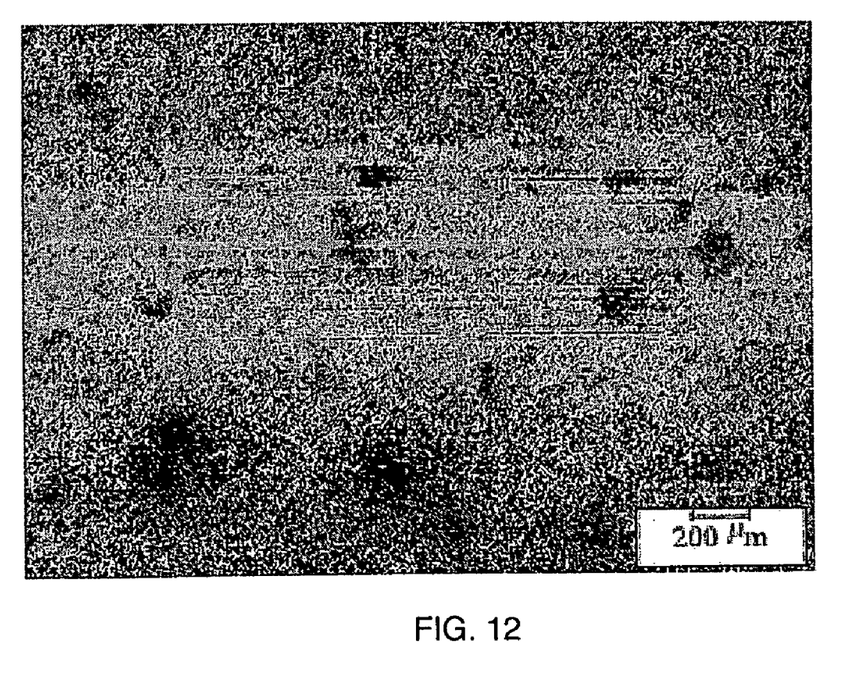
FIG. 12 is a diagram of an ultrafast laser trimmed of thermal spray line according to an embodiment of the present invention.

An SEM image of a trimmed line is shown in FIG. 12. The material is Ag sprayed onto a Ti substrate. The original line width as sprayed is roughly 500 μm. The laser-trimmed region is 80-100 μm in width, and 200 μm in length. For this case, 10 strips were used on each side of the line with the laser making two passes over each strip. The stage speed was 5 mm/s, and the process proceeds from the outside towards the centerline of the line such that the final pass on each side is closest to the centerline, which is done to avoid re-deposition of material on the trimmed portion of the line. Feature quality and uniformity are good.

The laser-machined regions cut into the substrate as well as the SPL. This happens because there is no indicator at this time to instruct the laser to stop cutting when the SPL line has been completely removed and the substrate is being removed. To guarantee the entire SPL line was removed, the stage speed was run slower than needed. To optimize the technique, parameters can be empirically determined to provide sufficient removal of material. Alternatively, the laser-processed region can be dynamically monitored to determine when the substrate has been reached. For example, the laser-processed feature can be monitored using a video camera or the ablated material can be analyzed using a fiber-optic spectrometer, shutting off the laser when substrate material begins to be ablated.

Figure 13:
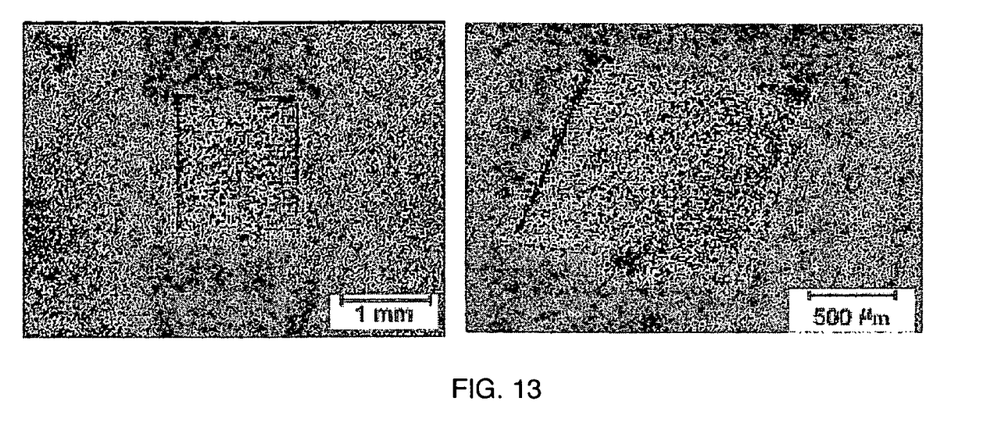
FIG. 13 is a diagram of laser-machined vias in a multilayer thermal spray structure according to an embodiment of the present invention.

Another observation made is that the trimmed lines are not perfectly sharp. Referring to FIG. 13, it can be seen that the spatial profile of the laser beam influences the trimmed line. The tighter the beam is focused (for a smaller spot size), the more sharp the "hourglass" shape of the beam becomes. If sharp, rectangular features are mandatory, it may be possible to prescribe a more complicated laser-material path to minimize beam profile effects that tend to round the tops of the trimmed lines.

Vias can be fabricated into a thermal-sprayed multilayer structure using the motion control system. Feature quality can be improved substantially. The vias, as with the handmade case, are done in a thermal sprayed electrical inductor comprising several layers, for example: Ti-substrate, bonding layer, ceramic insulator, bottom Ag conductor, ceramic insulator, ferrous inductor material, insulator, and top Ag conductor.

Figure 14:
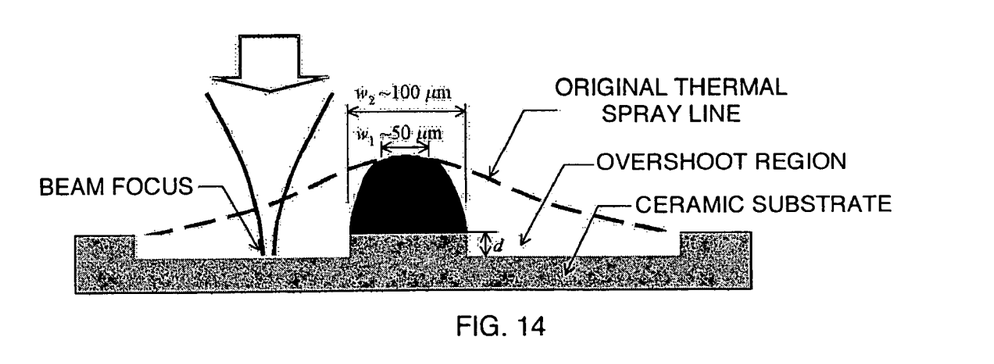
FIG. 14 is a diagram of a laser trimming process according to an embodiment of the present invention.

Feature quality and edge definition is very good. The perspective view on the right in FIG. 14 is slightly deeper near the edges. This occurs because the stage cannot accelerate or decelerate infinitely fast, and the stage velocity is slower in this region, resulting in more pulses per site and corresponding deeper features. This issue has been addressed and corrected recently.

Thermal spray technology is suited for developing multilayer sensors for enhanced performance. The thermopile concepts discussed above, for example, can be extended by fabricated several devices on top of one another. For example subsequent linear thermopiles can be fabricated on top of previous devices by thermal spraying an insulating layer between devices. In this fashion, all thermopiles would experience approximately the same temperature difference, however the individual devices could be electrically connected in either parallel or series, depending on the needs of the electrical load that the thermopile will drive.

Similarly, multiple sensors or devices could be fabricated on the same physical area on a substrate, for example, a thermocouple for temperature measurement, a strain gauge for strain measurement, a magnetic multilayer device and a microheater for periodic burn off of contaminants could be fabricated on the same physical footprint by using a multilayer fabrication approach, and is a natural extension of the thermal spray capabilities and strengths.

Having described embodiments for a method of fabricating conformal electronics using additive-subtractive techniques, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A method for fabricating an electronic or sensory device, comprising:
   providing a substrate;
   depositing a functional material by a thermal spray on the substrate; and
   removing a portion of the functional material and the substrate by non-thermal ablation via one of picosecond or femtosecond pulses from a laser to form regions in the functional material.

2. The method of claim 1, wherein the substrate is flexible.

3. The method of claim 1, wherein depositing is a direct writing.

4. The method of claim 1, wherein depositing a functional material further comprises heat treating the functional material.

5. The method of claim 4, wherein the heat treating is preformed one of before or after removing a portion of the functional material.

6. The method of claim 1, wherein depositing further comprises printing a feature of the electronic or sensory device onto a conformal shape of the substrate.

7. The method of claim 1, wherein depositing the functional material further comprises providing one of a metal, a semiconductor, a ceramic, and a polymer in the thermal spray.

8. The method of claim 1, wherein depositing the functional material further comprises providing one of a dielectric material and an insulating material.

9. The method of claim 1, wherein removing the portion of the functional material and the substrate further comprises providing a focused beam of the short pulsed laser to the functional material and the substrate, wherein the non-thermal ablation is stopped upon detection of ablated substrate material.

10. The method of claim 1, wherein the electronic device is fabricated in-situ.

11. The method of claim 1, further comprising coating a portion of the electronic device.

12. The method of claim 1, further comprising:
   depositing an insulating layer over the functional material after removing the portion, wherein the functional material is a bottom metal comprising at least two parallel strips, wherein a portion of each of the two parallel strips is exposed on each of at least two sides of the insulating layer;
   depositing a top metal of functional material by the thermal spray over the insulating layer and exposed portions of the two parallel strips; and
   removing a portion of the top metal of functional material, forming at least one strip, the at least one strip connecting a portion of one of the two parallel strips exposed on a first side of the insulating layer and a portion of a second strip of the two parallel strips exposed on a second side of the insulating layer.

13. The method of claim 1, wherein the thermal spray imparts one of kinetic, and thermal and kinetic energy into one of a powder, wire and rod material to deposit the functional material.

14. A method for fabricating an electronic device, comprising:
   providing a substrate;
   depositing a functional material by a thermal spray on the substrate with a thickness greater than about 20 microns; and
   removing a portion of the functional material and the substrate via a mask-free, non-thermal ablation via laser having a spot size of about 10 to 25 microns, patterning to form a pre-determined pattern of regions in the functional material, wherein the non-thermal ablation is stopped upon detection of ablated substrate material.

15. A method for fabricating an electronic or sensory device, comprising:
   providing a substrate;
   depositing a functional material by a thermal spray on the substrate; and
   removing a portion of the functional material and the substrate by non-thermal ablation via one of picosecond or femtosecond pulses from a laser to a pattern of an electric feature in the functional material, wherein a trimmed line of the functional material forming the pattern is non-conductive.

* * * * *